(12) United States Patent
Vanluchene

(10) Patent No.: US 9,147,815 B2
(45) Date of Patent: Sep. 29, 2015

(54) LIGHT EMITTING DIODE

(71) Applicant: LUXO-LED TAIWAN LIMITED, Taipei (TW)

(72) Inventor: Percy Vanluchene, Taipei (TW)

(73) Assignee: LUXO-LED TAIWAN LIMITED, Taipei (TW)

( * ) Notice: Subject to any disclaimer, the term of this patent is extended or adjusted under 35 U.S.C. 154(b) by 0 days.

(21) Appl. No.: 14/209,215

(22) Filed: Mar. 13, 2014

(65) Prior Publication Data

US 2014/0264264 A1  Sep. 18, 2014

Related U.S. Application Data

(60) Provisional application No. 61/790,350, filed on Mar. 15, 2013.

(51) Int. Cl.
*H01L 33/50* (2010.01)
*H01L 33/00* (2010.01)
*H01L 21/02* (2006.01)
*H01L 33/08* (2010.01)

(52) U.S. Cl.
CPC .......... *H01L 33/502* (2013.01); *H01L 33/0066* (2013.01); *H01L 21/0242* (2013.01); *H01L 21/0254* (2013.01); *H01L 33/08* (2013.01)

(58) Field of Classification Search
None
See application file for complete search history.

(56) References Cited

U.S. PATENT DOCUMENTS

| 2002/0003233 A1* | 1/2002 | Mueller-Mach et al. ....... 257/84 |
| 2007/0272930 A1* | 11/2007 | Tseng et al. ................... 257/79 |
| 2012/0104444 A1* | 5/2012 | Hwang et al. .................. 257/98 |

* cited by examiner

*Primary Examiner* — Steven Loke
*Assistant Examiner* — Arash Majdi
(74) *Attorney, Agent, or Firm* — Maschoff Brennan

(57) ABSTRACT

A light emitting diode (LED) and a method for manufacturing the same is disclosed. The disclosed LED comprises a first substrate, an epitaxy layer, and a plurality of bumps. The first substrate is doped with YAG: Ce and is for converting a first light with a first range of wavelength to a second light with a second range of wavelength. The epitaxy layer is disposed on the first substrate and is for emitting the first light. The plurality of bumps are disposed on the epitaxy layer. With the first substrate doped with YAG: Ce, the disclosed LED does not need additional phosphor to convert the first light with the first range of wavelength to the second light with the second range of wavelength.

11 Claims, 7 Drawing Sheets

LIGHT EMITTING DIODE

CROSS REFERENCE

The present disclosure is based on, and claims priority from the U.S. Provisional Application No. 61/790,350, filed on Mar. 15, 2013, the disclosure of which is hereby incorporated by reference herein in its entirety.

BACKGROUND

1. Technical Field

The present disclosure relates to a light emitting diode (LED), and more particularly relates to a LED with crystal substrate.

2. Related Art

Conventional light emitting diodes adopting the phosphor coating may experience the deterioration of the phosphor because the light emitted from the LED may overheat the phosphor coating, which is sensitive to the temperature. Meanwhile, because of the silicon dome overlaying the LED die the heat arising out of the operation of the LED may be confined within the silicon dome and the performance of the heat dissipation remains a lot to be desired.

SUMMARY

A light emitting diode (LED) and a method for manufacturing the same is disclosed. The disclosed LED comprises a first substrate, an epitaxy layer, and a plurality of bumps. The first substrate is doped with YAG: Ce and is for converting a first light with a first range of wavelength to a second light with a second range of wavelength. The epitaxy layer is disposed on the first substrate and is for emitting the first light. The plurality of bumps are disposed on the epitaxy layer. With the first substrate doped with YAG: Ce, the disclosed LED does not need additional phosphor to convert the first light with the first range of wavelength to the second light with the second range of wavelength.

In order to make the aforementioned and other features of the present disclosure more comprehensible, several embodiments accompanied with figures are described in detail below.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

Figure 1A:
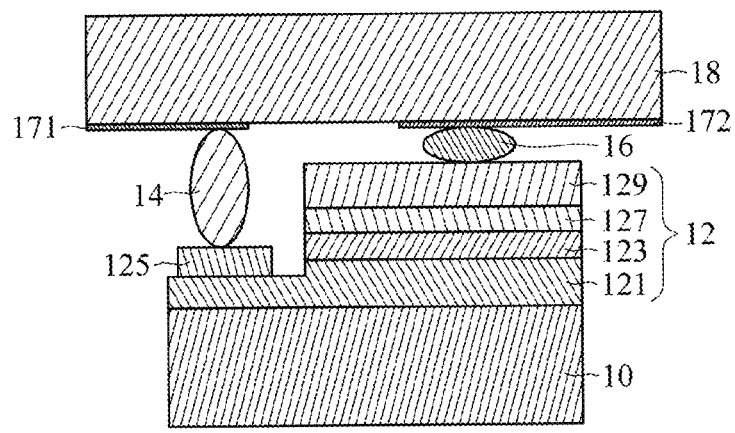
FIG. 1A is a schematic diagram of a cross-sectional view of a light emitting diode according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1A, which is a schematic diagram of a cross-sectional view of a light emitting diode according to one embodiment of the present disclosure. As shown in FIG. 1A, a light emitting diode 1a may comprise a substrate 10, an epitaxy layer 12, a bump 14, a bump 16, a conductive layer 171, a conductive layer 172, and a substrate 18. The substrate 10 may be a transparent substrate doped/fused with yttrium aluminum garnet doped cerium (YAG: Ce) and used for color converting. That is, light with a first range of wavelength inputting the substrate 10 would be converted to output light with a second rage of wavelength. The epitaxy layer 12 is disposed, or equivalently epitaxy grown, on the substrate 10 and used for light emitting. The bump 14 and the bump 16 are disposed on the epitaxy layer and for connecting to an electrical power so that the epitaxy layer 12 is exited by the electrical power and emitting light. The substrate 18 is bonding to the bump 14 and the bump 16 via the conductive layer 171 and the conductive layer 172, respectively. The bump 14 and the bump 16 may be solder bumps, semiconductor bumps, or any other conductive bumps. The material of either of the conductive layer 171 and the conductive layer 172 may be metal, indium tin oxide, or any other conductive materials.

Figure 1B:
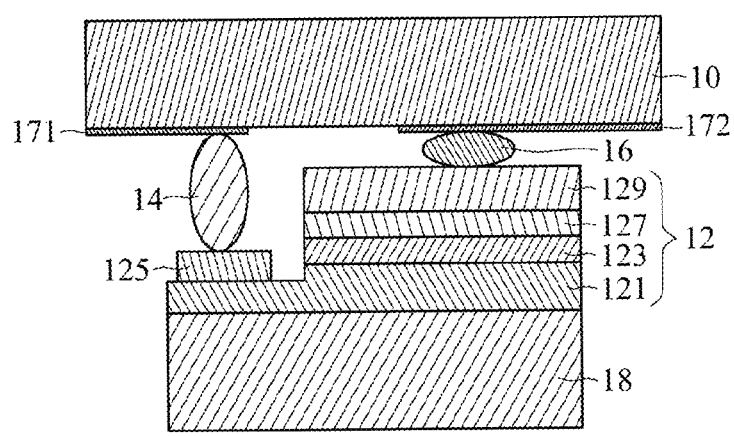
FIG. 1B is a schematic diagram of a cross-sectional view of a light emitting diode according to another embodiment of the present disclosure.

Please refer to FIG. 1B, which is a schematic diagram of a cross-sectional view of a light emitting diode according to another embodiment of the present disclosure. As shown in FIG. 1B, a light emitting diode 1b has all compositions as the light emitting diode 1a shown in FIG. 1A but the substrate 10 and the substrate 18 in the light emitting diode 1b are location swapped. That is, the epitaxy layer 12 is disposed, or equivalently epitaxy grown, on the substrate 18 and used for light emitting. The bump 14 and the bump 16 are disposed on the epitaxy layer and for connecting to an electrical power so that the epitaxy layer 12 is exited by the electrical power and emitting light. The substrate 10, which is doped with YAG: Ce, is bonding to the bump 14 and the bump 16 via the conductive layer 171 and the conductive layer 172, respectively.

In practice, the substrate 10 may be a silicon-based substrate or any other metalloid-based substrate and fused with YAG: Ce. In one embodiment, the substrate 10 may be fused/doped with YAG: Ce and YAG: Ce, Mn. Specifically, by changing the chemical composition of the doping material for the substrate 10 the color of the outputted light may become controllable. For example, the invisible light may be outputted after the invisible light as an inputted light has been received by the substrate 10. In one embodiment, light with the first range of wavelength inputting the substrate 10 may be blue ray and the color of the outputting light with the second range of wavelength may be white light, yellow light, orange light, violet light, infrared, ultraviolet A, ultraviolet B, or ultraviolet C.

Figure 2A:
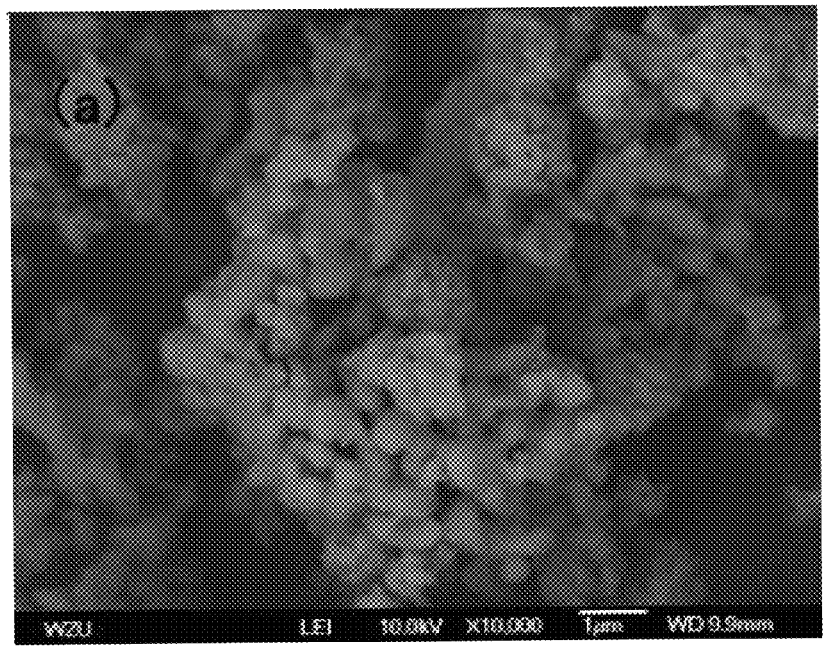
FIG. 2A is a scanning electronic microscope (SEM) image of YAG: $Ce_{0.06}$.
Figure 2B:
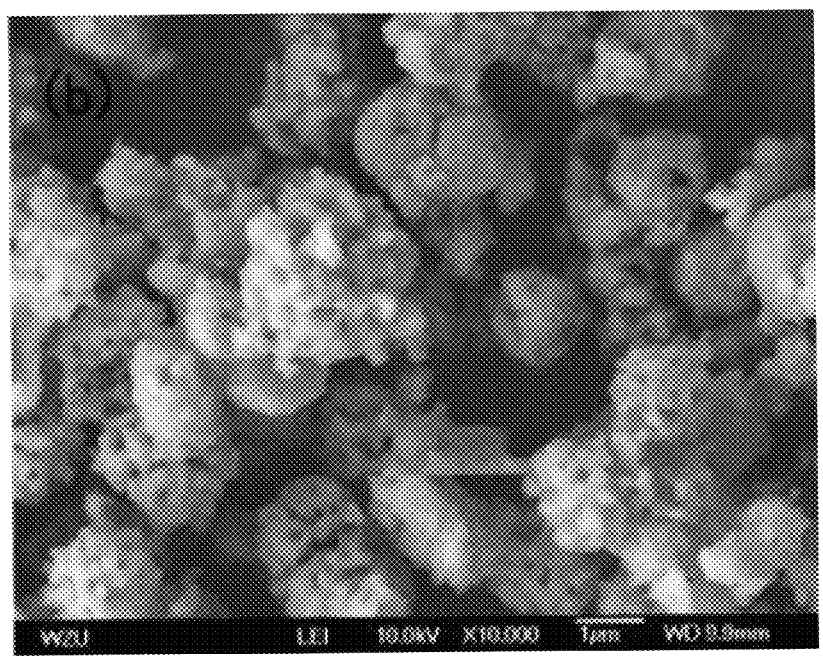
FIG. 2B and FIG. 2C are SEM images of YAG: $Ce_{0.06}$, $Mn_{0.08}$ with different magnification.
Figure 2C:
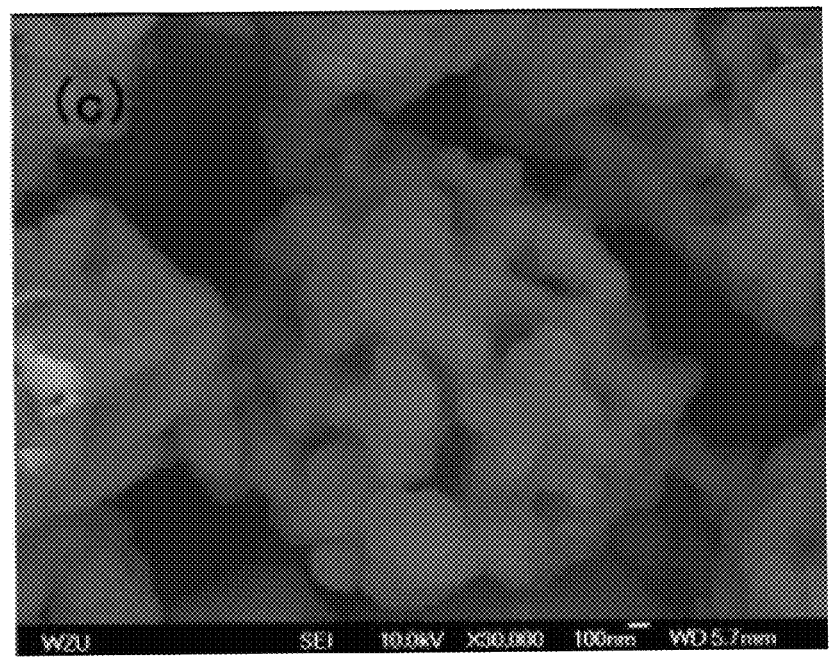

As to the composition of the doping materials aforementioned, please refer to FIG. 2A to FIG. 2C, wherein FIG. 2A is a scanning electronic microscope (SEM) image of YAG: $Ce_{0.06}$, and FIG. 2B and FIG. 2C are SEM images of YAG: $Ce_{0.06}$, $Mn_{00.08}$ with different magnification. According to FIG. 2A to FIG. 2C, it may be found that the size of the crystalline of the YAG phosphor ranges from 200 nanometer (nm) to 500 nm, with the increase of the manganese (Mn) ion concentration. The material also became spherical with the addition of the Mn ions. All of the microspheres have similar sizes and morphologies.

Figure 3:
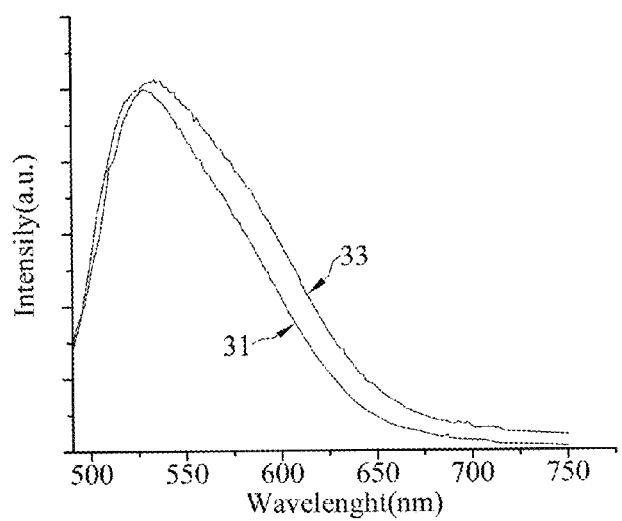
FIG. 3 illustrates the emission spectra of YAG: $Ce_{0.06}$ and YAG: $Ce_{0.06}$, $Mn_{0.08}$ according to one embodiment of the present disclosure.

It is discussed and disclosed that the morphology and the microstructure of the doping material, YAG: Ce, Mn, vary as the concentration of the Mn ion in the doping material. As the microstructure of the doping material, YAG: Ce, Mn, varies, the excitation spectrum and the emission spectrum of the doped substrate, the substrate 10, vary. Please refer to FIG. 3, which illustrates the emission spectra of YAG: $Ce_{0.06}$ and YAG: $Ce_{0.06}$, $Mn_{0.08}$ according to one embodiment of the present disclosure. As shown in FIG. 3, the horizontal axis relates to the wavelength of the emission light and the vertical axis relates to the intensity of the emission light. The curve 31 illustrates the emission spectrum of YAG: $Ce_{0.06}$ and the curve 33 illustrates the emission spectrum of YAG: $Ce_{0.06}$, $Mn_{0.08}$. It may be noted that the full width at half maximum intensity (FWHM) of the curve 31, the emission spectrum of YAG: $Ce_{0.06}$, is about 92 nanometers (nm) and the wavelength of the emission light with the maximum intensity of the curve 31 is 528 nm. It may also be noted that the full width at half maximum intensity (FWHM) of the curve 33, the emission spectrum of YAG: $Ce_{0.06}$, $Mn_{0.08}$, is about 103 nm and the wavelength of the emission light with the maximum intensity of the curve 33 is 538 nm.

Figure 4A:
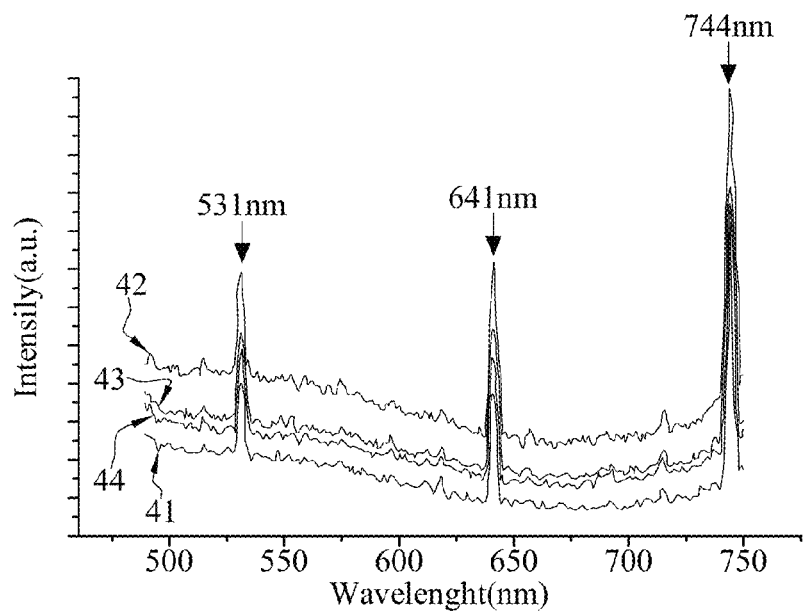
FIG. 4A illustrates emission spectra of YAG: Ce, Mn for excitation at 390 nm according to one embodiment of the present disclosure.
Figure 4B:
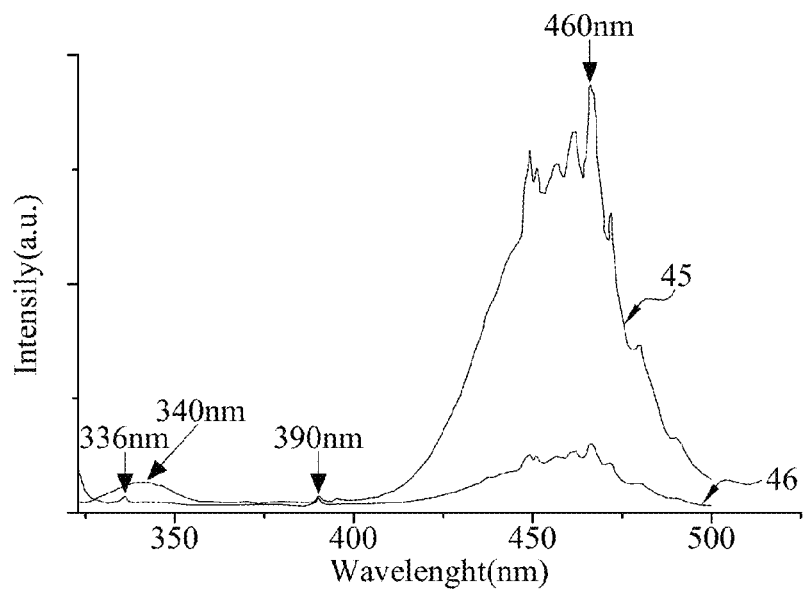
FIG. 4B and FIG. 4C illustrate excitation spectra of YAG: Ce, Mn according to one embodiment of the present disclosure.
Figure 4C:
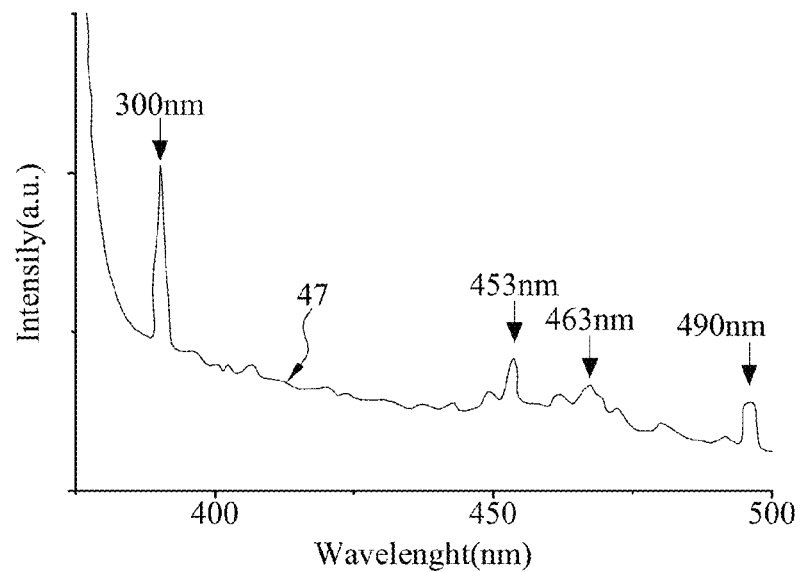

In advance, please refer to FIG. 4A, FIG. 4B and FIG. 4C, wherein FIG. 4A illustrates emission spectra of YAG: Ce, Mn for excitation at 390 nm according to one embodiment of the present disclosure and FIG. 4B and FIG. 4C illustrate excitation spectra of YAG: Ce, Mn according to one embodiment of the present disclosure. As shown in FIG. 4A, the curve 41 illustrates the emission spectrum of YAG: $Ce_{0.06}$, $Mn_{0.02}$ excited by 390 nm light; the curve 42 illustrates the emission spectrum of YAG: $Ce_{0.06}$, $Mn_{0.04}$ excited by 390 nm light; curve 43 illustrates the emission spectrum of YAG: $Ce_{0.06}$, $Mn_{0.06}$ excited by 390 nm light; and curve 44 illustrates the emission spectrum of YAG: $Ce_{0.06}$, $Mn_{0.08}$ excited by 390 nm light.

It is noted that the intensity of the emission light of each kind of samples peaks at wavelength of 531 nm, 641 nm, and 744 nm, which cannot be excited in pure YAG: Ce. Then, as shown in FIG. 4B and FIG. 4C, the curve 45 illustrates the excitation spectrum of YAG: Ce, Mn with the wavelength of the emission light at 531 nm; the curve 46 illustrates the excitation spectrum of YAG: Ce, Mn with the wavelength of the emission light at 641 nm; and the curve 47 illustrates the excitation spectrum of YAG: Ce, Mn with the wavelength of the emission light at 744 nm. According to the curve 45 and the curve 46, it may be concluded that the efficiency of excitation is better when the wavelength is from 400 nm to 500 nm and peaks at about the wavelength of 460 nm. In addition, the intensity of the excitation spectra, the curve 45, the curve 46, and the curve 47, is non-zero when the wavelength is around 300 nm to 350 nm. That is, to emit light with wavelength of 531 nm, 641 nm, or 744 nm, the excitation light may have wavelength ranging from 300 nm to 500 nm. It is better to have the excitation light with wavelength ranging from 390 nm to 490 nm.

Figure 5A:
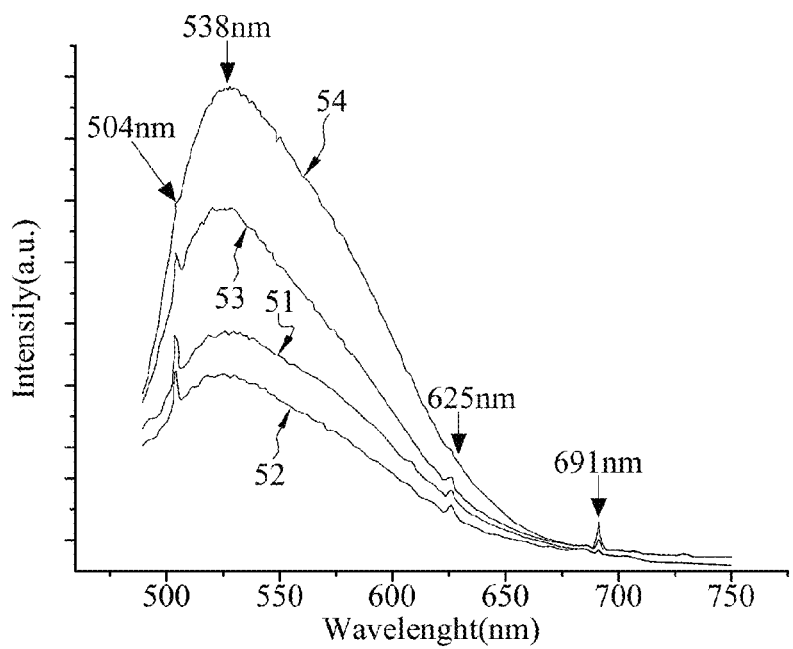
FIG. 5A illustrates emission spectra of YAG: Ce, Mn for excitation at 460 nm according to one embodiment of the present disclosure.
Figure 5B:
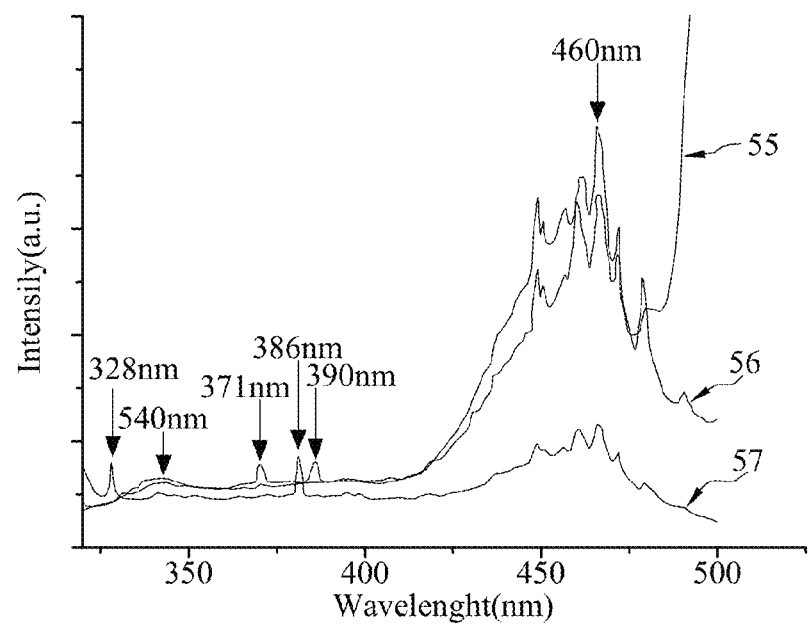
FIG. 5B and FIG. 5C illustrate excitation spectra of YAG: Ce, Mn according to one embodiment of the present disclosure.
Figure 5C:
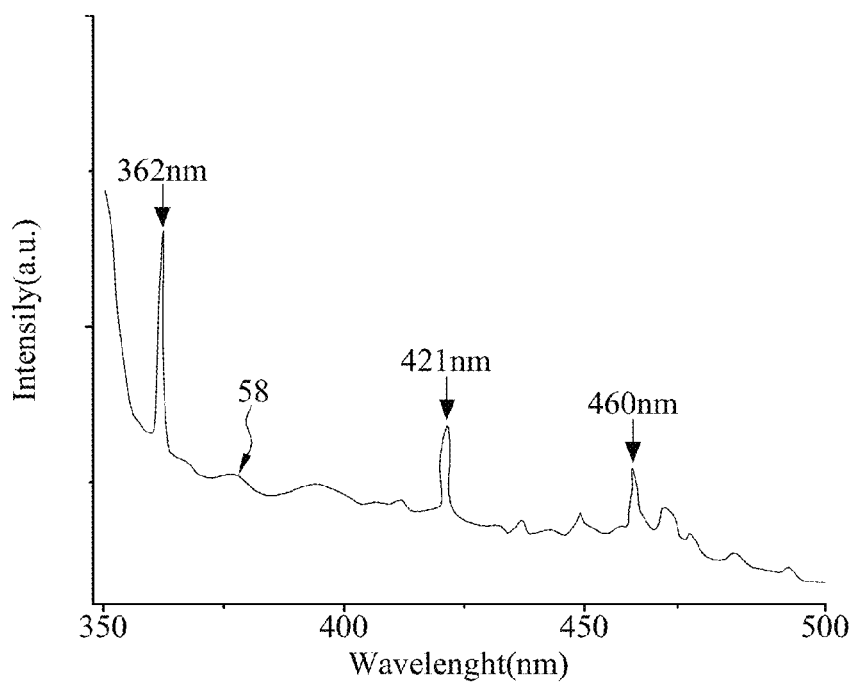

It is known from FIG. 4B that the excitation light having wavelength at 460 nm has the highest excitation efficiency, so please refer to FIG. 5A, FIG. 5B, and FIG. 5C, wherein FIG. 5A illustrates emission spectra of YAG: Ce, Mn for excitation at 460 nm according to one embodiment of the present disclosure and FIG. 5B and FIG. 5C illustrate excitation spectra of YAG: Ce, Mn according to one embodiment of the present disclosure. As shown in FIG. 5A, the curve 51 illustrates the emission spectrum of YAG: $Ce_{0.06}$, $Mn_{0.02}$ excited by 460 nm light; the curve 52 illustrates the emission spectrum of YAG: $Ce_{0.06}$, $Mn_{0.04}$ excited by 460 nm light; curve 53 illustrates the emission spectrum of YAG: $Ce_{0.06}$, $Mn_{0.06}$ excited by 460 nm light; and curve 54 illustrates the emission spectrum of YAG: $Ce_{0.06}$, $Mn_{0.08}$ excited by 460 nm light.

It is noted that the intensity of the emission light of each kind of samples peaks at wavelength of 504 nm, 538 nm, 625 nm, and 691 nm, which cannot be excited in pure YAG: Ce. Then, as shown in FIG. 5B and FIG. 5C, the curve 55 illustrates the excitation spectrum of YAG: Ce, Mn with the wavelength of the emission light at 504 nm; the curve 56 illustrates the excitation spectrum of YAG: Ce, Mn with the wavelength of the emission light at 538 nm; the curve 57 illustrates the excitation spectrum of YAG: Ce, Mn with the wavelength of the emission light at 625 nm; and the curve 58 illustrates the excitation spectrum of YAG: Ce, Mn with the wavelength of the emission light at 691 nm. According to the curve 55, the curve 56, and the curve 57, it may be concluded that the efficiency of excitation is better when the wavelength is from 400 nm to 500 nm and peaks at about the wavelength of 460 nm. In addition, the intensity of the excitation spectra, the curve 55, the curve 56, the curve 57, and the curve 58, is non-zero when the wavelength is around 300 nm to 350 nm. That is, to emit light with wavelength of 504 nm, 538 nm, 625 nm, or 691 nm, the excitation light may have wavelength ranging from 300 nm to 500 nm. It is better to have the excitation light with wavelength ranging from 390 nm to 490 nm.

According to the results presented above, it may be concluded that the substrate 10 doped/fused with YAG: Ce and even YAG: Ce, Mn in addition may be excited by light with wavelength ranging from 300 nm to 500 nm and consequently emits visible light having the intensity peaking at around 530 nm. Hence, the substrate 10, doped/fused with YAG: Ce-like crystal may replace conventional sapphire substrate in the conventional LED structure so that the LED with the substrate 10 needn't additional phosphor.

In one embodiment, please refer back to FIG. 1 for the structure of the epitaxy layer 12. The epitaxy layer 12 may comprise an n-type semiconductor layer 121 disposed on the substrate 10, an multi-quantum-well (MQW) layer 123 disposed on the n-type semiconductor layer 121, an n-type electrode 125 disposed on the n-type semiconductor layer 121, a p-type semiconductor layer 127 disposed on the MQW layer 123, and a p-type electrode 129 disposed on the p-type semiconductor layer 127. The bump 14 is disposed on the n-type electrode 125 and the bump 16 is disposed on the p-type electrode 129. The semiconductor layers, such as the n-type semiconductor layer 121 and the p-type semiconductor layer 127, may be III-V semiconductor layers. For example, the material of the n-type semiconductor layer 121 or the p-type semiconductor layer 127 may be gallium nitride (GaN), indium gallium nitride (InGaN), aluminum nitride (AlN), aluminum gallium nitride (AlGaN), aluminum gallium indium nitride (AlGaInN), or any other III-V semiconductor applicable for emitting light with wavelength ranging from 300 nm to 500 nm. When the epitaxy layer 12 emits light, the emitted light passes the substrate 10 and excites the YAG: Ce and/or the YAG: Ce, Mn in the substrate 10 so that the output light of the LED 1a is different from the emitted light from the epitaxy layer 12.

Figure 6:
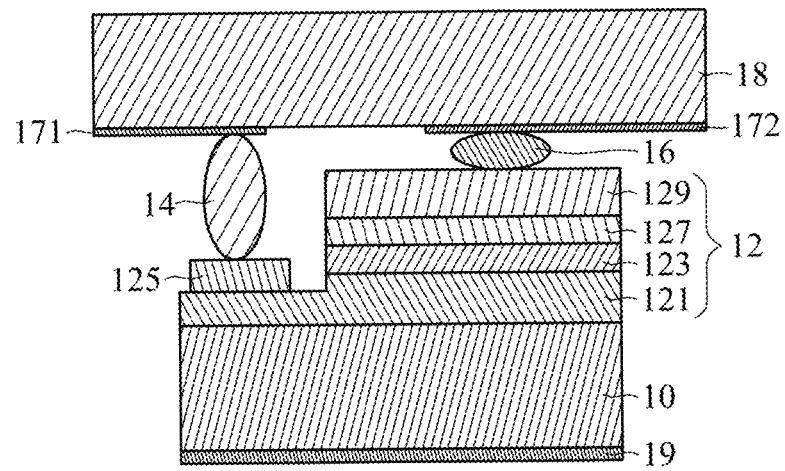
FIG. 6 is a schematic diagram of a cross-sectional view of a light emitting diode according to yet another embodiment of the present disclosure.

In yet another embodiment, please refer to FIG. 6, which is a schematic diagram of a cross-sectional view of a light emitting diode according to yet another embodiment of the present disclosure. As shown in FIG. 6, a light emitting diode 1c, compared with the light emitting diode 1a shown in FIG. 1A, further comprises a modulating layer 19 and the substrate 10 is sandwiched by the epitaxy layer 12 and the modulating layer 19. The modulating layer 19 may be used for tuning the light spectrum, such as the correlated color temperature, color rendering index, color quality scale, etc., and/or controlling the beam angle of the emitted light. For example, the modulating layer 19 may be a micro lens array (MLA) so as to produce parallel emitted light. In another application, the modulating layer 19 may be multi-layer thin film coating so that the emitted light from the LED 1c may have particular spectrum. The modulating layer 19 may comprise nanocrystal structures or quantum dots structures or any other structures depending on the applications. As a conclusion, the modulating layer 19 may be used for controlling or changing characteristics of the output light of the LED 1c, such as the beamangle and/or the spectrum of the output light.

Figure 7:
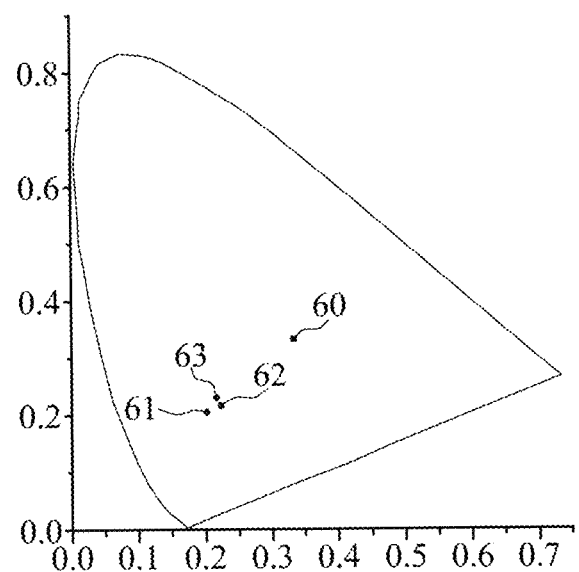
FIG. 7 illustrates the CIE color coordinates of YAG: Ce and YAG: Ce, Mn phosphors excited by blue light according to one embodiment of the present disclosure.

Please now refer to FIG. 7, which illustrates the CIE color coordinates of YAG: Ce and YAG: Ce, Mn phosphors excited by blue light according to one embodiment of the present disclosure. As shown in FIG. 7, the point 60 coordinating (0.33, 0.33) relates to white light, the point 61 coordinating (0.203, 0.167) relates to the YAG: $Ce_{0.06}$ phosphor, the point 62 coordinating (0.249, 0.181) relates to the YAG: $Ce_{0.06}$, $Mn_{0.04}$ phosphor, and the point 63 coordinating (0.233, 0.194) relates to the YAG: $Ce_{0.06}$, $Mn_{0.08}$ phosphor. It can be concluded from FIG. 6 that the YAG: Ce, Mn phosphor is better than the YAG: Ce phosphor for producing white light whose CIE coordinates is (0.33, 0.33). Therefore, YAG: Ce, Mn blended with YAG: Ce has an improved white light emission spectrum.

In one embodiment, to manufacture the disclosed LED, the process may comprise: doping or fusing a first substrate with YAG: Ce, performing an epitaxy growth process to grow an epitaxy layer on the first substrate, disposing a plurality of bumps on the epitaxy layer, and bonding a second substrate to the bumps. The epitaxy growth process, according to one or more exemplary embodiments of the present disclosure, may be a metal organic chemical vapor deposition (MOCVD) based manufacturing process or a hydride vapor phase epitaxy (HVPE) based manufacturing process In another embodiment, to manufacture the disclosed LED with an improved white light emission spectrum, the step of doping or fusing the first substrate with YAG: Ce may comprise: blending YAG: Ce, Mn with YAG: Ce to produce a first doping material, YAG: $Ce_x$, $Mn_y$, and fusing the first doping material with the first substrate. In the step, x and y are positive numbers.

In the disclosed LED, according to one or more exemplary embodiments of the present disclosure, the conventional sapphire substrate used in the conventional LED is replaced by the crystal substrate doped/fused with YAG: Ce and/or YAG: Ce, Mn. As a consequence, no additional phosphor is needed for producing whit light with blue light LED. Additionally, the crystal substrate has better heat dissipation ability than the conventional phosphor glue has, so the degradation of the emission efficiency or the white light emission spectrum because of the deterioration of the phosphor may be prevented in the disclosed LED.

The foregoing description of the exemplary embodiments of the present disclosure has been presented only for the purposes of illustration and description and is not intended to be exhaustive or to limit the invention to the precise forms disclosed. Many modifications and variations are possible in light of the above teaching.

The embodiments were chosen and described in order to explain the principles of the present disclosure and their practical application so as to activate others skilled in the art to utilize the present disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A light emitting diode, comprising:
    a first substrate doped with yttrium aluminum garnet doped cerium (YAG: Ce) and for converting a first light with a first range of wavelength to a second light with a second range of wavelength;
    an epitaxy layer disposed on the first substrate and for emitting the first light; and
    a plurality of bumps disposed on the epitaxy layer,
    wherein the first substrate is further doped with manganese co-doped yttrium aluminum garnet doped cerium (YAG: Ce, Mn) to form YAG: $Ce_x, Mn_y$, wherein both x and y are positive numbers.

2. The light emitting diode according to claim 1, further comprising a modulating layer for controlling characteristics of the second light, wherein the first substrate is sandwiched by the epitaxy layer and the modulating layer.

3. The light emitting diode according to claim 1, wherein x is 0.06 and y is between 0.02 and 0.08.

4. The light emitting diode according to claim 1, wherein the epitaxy layer emits the first light and the first range of wavelength is between 300 nm to 500 nm.

5. The light emitting diode according to claim 4, wherein the first range of wavelength is between 390 nm to 460 nm.

6. A method for manufacturing light emitting diodes, wherein the method comprises:
    doping a first substrate with yttrium aluminum garnet doped cerium (YAG: Ce);
    performing an epitaxy growth process to grow an epitaxy layer on the first substrate;
    disposing a plurality of bumps on the epitaxy layer; and
    bonding a second substrate to the bumps.

7. The method according to claim 6, wherein the step of doping the first substrate with yttrium aluminum garnet doped cerium (YAG: Ce) comprises:
    blending manganese co-doped yttrium aluminum garnet doped cerium (YAG: Ce, Mn) with YAG: Ce to produce a first doping material as YAG: $Ce_x, Mn_y$, wherein x and y are positive numbers; and
    fusing the first doping material with the first substrate.

8. The method according to claim 6, wherein the epitaxy growth process is a metal organic chemical vapor deposition based manufacturing process or a hydride vapor phase epitaxy based manufacturing process.

9. A light emitting diode, comprising:
a silicon-based substrate doped with yttrium aluminum garnet doped cerium (YAG: Ce) and for converting a first light with a first range of wavelength to a second light with a second range of wavelength;
an epitaxy layer disposed on the silicon-based substrate and for emitting the first light; and
a plurality of bumps disposed on the epitaxy layer.

10. A light emitting diode, comprising:
a first substrate doped with yttrium aluminum garnet doped cerium (YAG: Ce) and for converting a first light with a first range of wavelength to a second light with a second range of wavelength, wherein the first substrate is further doped with manganese co-doped yttrium aluminum garnet doped cerium (YAG: Ce, Mn) to form YAG: $Ce_x$, $Mn_y$, wherein both x and y are positive numbers,
an epitaxy layer disposed on the first substrate and for emitting the first light, and the epitaxy layer comprising:
an n-type III-V semiconductor layer disposed on the first substrate;
an multi-quantum-well (MQW) layer disposed on the n-type semiconductor layer;
an n-type electrode disposed on the n-type semiconductor layer;
a first bump disposed on the n-type electrode;
a p-type III-V semiconductor layer disposed on the MQW layer;
a p-type electrode disposed on the p-type semiconductor layer;
a second bump disposed on the p-type electrode.

11. The light emitting diode according to claim 10, wherein the III-V semiconductor layers are gallium nitride (GaN) layers.

* * * * *